(12) United States Patent
Harr et al.

(10) Patent No.: US 9,905,526 B2
(45) Date of Patent: Feb. 27, 2018

(54) ELECTRONIC COMPONENT PACKAGE AND METHOD OF MANUFACTURING THE SAME

(71) Applicant: SAMSUNG ELECTRO-MECHANICS CO., LTD., Suwon-si, Gyeonggi-do (KR)

(72) Inventors: Kyoung Moo Harr, Suwon-si (KR); Ji Hoon Kim, Suwon-si (KR); Kyung Seob Oh, Suwon-si (KR); Sun Ho Kim, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/192,634

(22) Filed: Jun. 24, 2016

(65) Prior Publication Data
US 2017/0125318 A1    May 4, 2017

(30) Foreign Application Priority Data
Nov. 3, 2015  (KR) .......................... 10-2015-0153734

(51) Int. Cl.
*H01L 23/00* (2006.01)
*H01L 23/48* (2006.01)
*H01L 23/31* (2006.01)

(52) U.S. Cl.
CPC .......... *H01L 24/16* (2013.01); *H01L 23/3128* (2013.01); *H01L 23/481* (2013.01); *H01L 24/19* (2013.01); *H01L 24/20* (2013.01); *H01L 2224/04105* (2013.01); *H01L 2224/12105* (2013.01); *H01L 2924/3025* (2013.01); *H01L 2924/3512* (2013.01)

(58) Field of Classification Search
CPC ... H01L 23/043; H01L 23/045; H01L 23/053; H01L 23/055
See application file for complete search history.

(56) References Cited

U.S. PATENT DOCUMENTS

| | | | | |
|---|---|---|---|---|
| 2003/0122223 | A1* | 7/2003 | Nakamura | ............ H01L 23/057 257/668 |
| 2007/0181895 | A1* | 8/2007 | Nagai | ................. H01L 33/0079 257/98 |
| 2014/0252573 | A1* | 9/2014 | Lin | ......................... H01L 24/19 257/666 |
| 2015/0279761 | A1* | 10/2015 | Bet-Shliemoun | ....... H01L 23/04 257/714 |

FOREIGN PATENT DOCUMENTS

| | | |
|---|---|---|
| KR | 10-0766022 B1 | 10/2007 |
| KR | 10-1026427 B1 | 4/2011 |
| KR | 10-1362714 B1 | 2/2014 |

* cited by examiner

*Primary Examiner* — Cuong Q Nguyen
(74) *Attorney, Agent, or Firm* — McDermott Will & Emery LLP

(57) ABSTRACT

An electronic component package includes a redistribution layer, an electronic component disposed on the redistribution layer, and an encapsulant encapsulating the electronic component. The electronic component has a trench formed in one side thereof.

20 Claims, 10 Drawing Sheets

ELECTRONIC COMPONENT PACKAGE AND METHOD OF MANUFACTURING THE SAME

CROSS-REFERENCE TO RELATED APPLICATION

This application claims benefit of priority to Korean Patent Application No. 10-2015-0153734 filed on Nov. 3, 2015, with the Korean Intellectual Property Office, the disclosure of which is incorporated herein by reference.

TECHNICAL FIELD

The present disclosure relates to an electronic component package and a method of manufacturing the same.

BACKGROUND

An electronic component package refers to a type of package technology for electrically connecting an electronic component to a printed circuit board (PCB), for example, a main board of an electronic device, or the like, and protecting the electronic component from external impacts, and is distinguishable from a technology of simply embedding an electronic component in a printed circuit board, for example, interposer substrate technology. Meanwhile, one recent main trend in the development of technology related to electronic components is to reduce the size of electronic components. Therefore, in the field of packages, in accordance with a rapid increase in demand for small electronic components, and the like, the implementation of an electronic component package having a small size and including a plurality of pins has been demanded.

One type of package technology, suggested in order to satisfy the technical demand as described above, is a wafer level package (WLP) using a redistribution wiring on an electrode pad of an electronic component formed on a wafer. Examples of the wafer level packages include a fan-in wafer level package and a fan-out wafer level package. Particularly, the fan-out wafer level package has a small size and is advantageous in implementing a plurality of pins. Therefore, recently, the fan-out wafer level package has been actively developed.

Meanwhile, in a case in which the electronic component package is mounted on the main board of an electronic device, or the like, since a difference between coefficients of thermal expansion (CTEs) of the electronic component and the main board is generally significantly high, a crack may be generated in a connection terminal, for example, a solder ball, connecting the electronic component package and the main board to each other when the electronic component package mounted on the main board is exposed to a harsh environment.

SUMMARY

An aspect of the present disclosure may provide a novel electronic component package in which board level reliability is improved, and a method of manufacturing the same.

According to an aspect of the present disclosure, a trench may be formed in one side of an electronic component to reduce an overall volume of the electronic component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
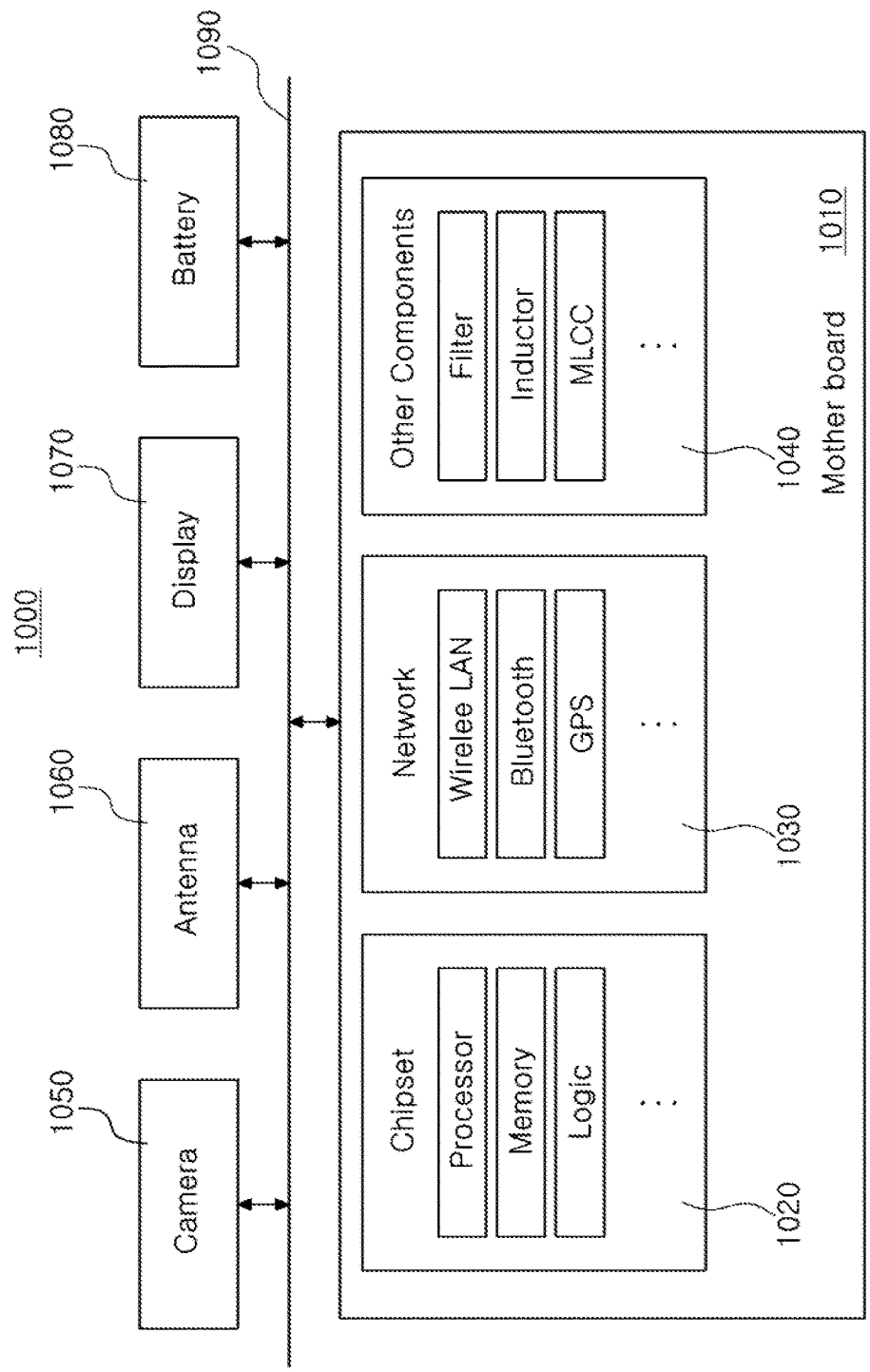
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, or the like may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram schematically illustrating an example of an electronic device system.

Referring to FIG. 1, an electronic device 1000 may accommodate a mother board 1010 therein. Chip related components 1020, network related components 1030, other components 1040, and the like, may be physically and/or electrically connected to the mother board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphic processor (for example, a graphic processing unit (GPU)), a digital signal processor, a cryptographic processor, a microprocessor, a microcontroller, or the like; a logic chip such as an analog-to-digital converter, an application-specific integrated circuit (ASIC), or the like, and the like. However, the chip related components 1020 are not limited thereto, but may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, but may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), and the like. However, other components 1040 are not limited thereto, but may also include passive components used for various other purposes, and the like. In addition, these components 1040 may be combined with each other together with the chip related components 1020 and/or the network related components 1030 described above.

The electronic device 1000 may include other components that are or are not physically and/or electrically connected to the mother board 1010 depending on a type thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) (not illustrated), a digital versatile disk (DVD) (not illustrated), and the like. However, these other components are not limited thereto, but may also include other components used for various purposes depending on a kind of electronic device 1000.

The electronic device 1000 may be a smartphone, a personal digital assistant, a digital video camera, a digital still camera, a network system, a computer, a monitor, a tablet, a laptop, a netbook, a television, a video game machine, a smartwatch, or the like. However, the electronic device 1000 is not limited thereto, and may also be any other electronic device processing data.

Figure 2:
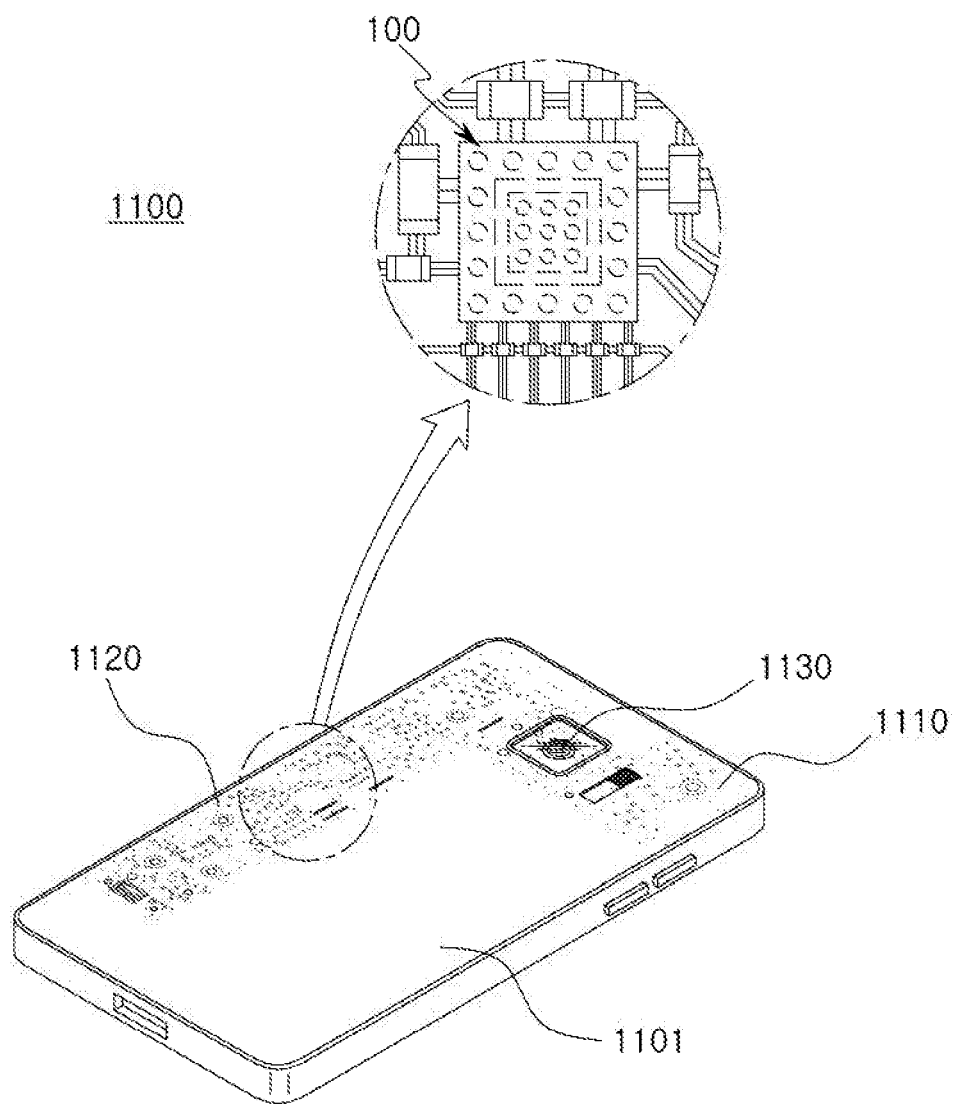
FIG. 2 is a view schematically illustrating an example of an electronic component package used in an electronic device.

FIG. 2 is a view schematically illustrating an example of an electronic component package used in an electronic device.

The electronic component package may be used for various purposes in the various electronic devices 1000 as described above. For example, a main board 1110 may be accommodated in a body 1101 of a smart phone 1100, and various electronic components 1120 may be physically and/or electrically connected to the main board 1110. In addition, another component that may or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but are not limited thereto.

Electronic Component Package

Figure 3:
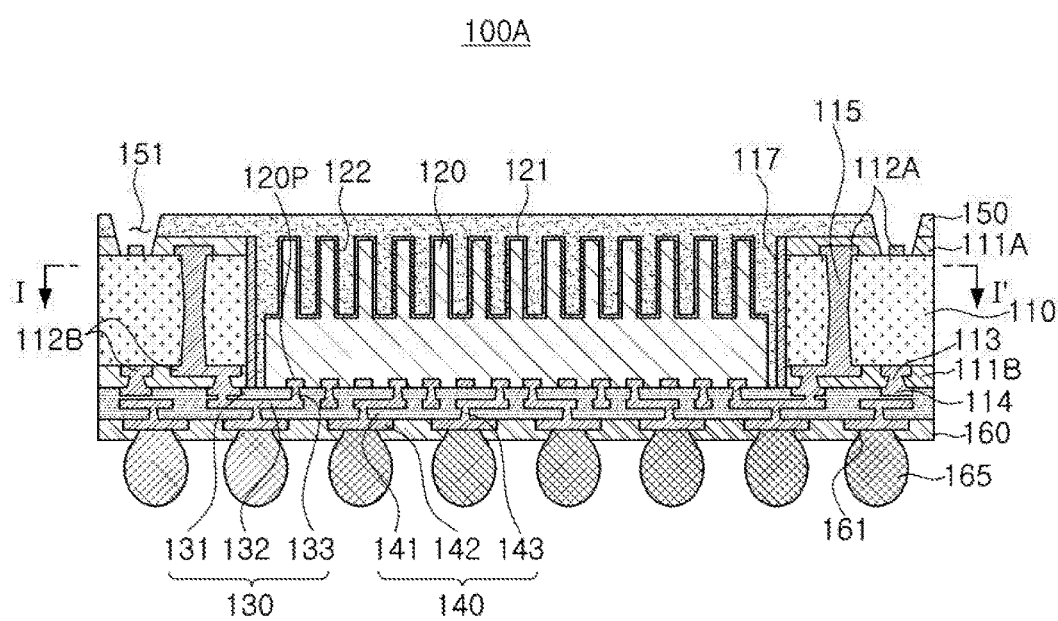
FIG. 3 is a cross-sectional view schematically illustrating an example of an electronic component package.

FIG. 3 is a cross-sectional view schematically illustrating an example of an electronic component package.

Figure 4:
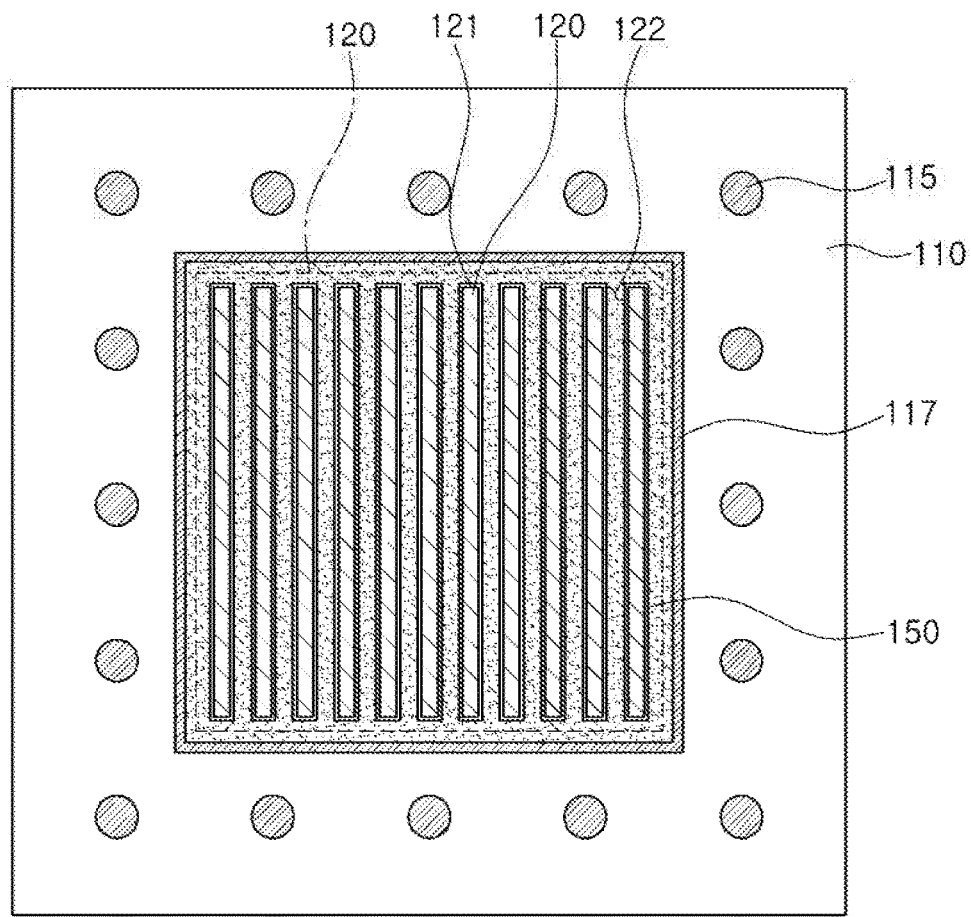
FIG. 4 is a schematic plan view of the electronic component package taken along line I-I' of FIG. 3.

FIG. 4 is a schematic plan view of the electronic component package taken along line I-I' of FIG. 3.

FIGS. 5A through 5D are perspective views schematically illustrating various shapes of the electronic component of FIG. 3.

Referring to FIGS. 3 through 5D, an electronic component package 100A according to an example may include redistribution layers 130 and 140, an electronic component 120 disposed on the redistribution layers 130 and 140, and an encapsulant 150 encapsulating the electronic component 120. The electronic component 120 has trenches 122 formed at an upper side thereof and electrode pads 120P disposed at a lower side thereof.

Generally, in a case in which the electronic component package is mounted on the main board of the electronic device, or the like, since a difference between coefficients of thermal expansion (CTEs) of the electronic component and the main board is significantly large (in a case in which the electronic component is an Si based integrated circuit, a CTE of the electronic component is approximately 3 ppm, and a CTE of the main board is approximately 20 to 30 ppm), a crack may be generated in a connection terminal, for example, a solder ball, connecting the electronic component package and the main board to each other, when the electronic component package mounted on the main board is exposed to a harsh environment. In more detail, warpage may be generated in the electronic component package and the main board due to the difference between the CTE of the electronic component and the main board. Here, the warpage generated in the electronic component package and the warpage generated in the main board act in opposite directions, such that stress may be concentrated on the connection terminal, for example, the solder ball, connecting the electronic component package and the main board to each other. As a result, the crack may be generated.

On the other hand, in a case in which the trenches 122 are formed by processing the upper side of the electronic component 120 as in the electronic component package 100A according to an example, an overall volume of the electronic component 120 may be reduced. Since an effective CTE of the electronic component package 100A is increased due to the reduction in the volume of the electronic component 120, a difference between CTE of the electronic component package and the main board may be reduced, such that board level reliability may be improved. In addition, since the trenches 122 increase contact areas between the electronic component 120 and the encapsulant 150 fixing the electronic component 120, they may improve close adhesion between the electronic component 120 and the encapsulant 150.

Hereinafter, respective components of the electronic component package 100A according to an example will be described in more detail.

The electronic component 120 may be various active components (for example, a diode, a vacuum tube, a transistor, and the like) or passive components (for example, an inductor, a condenser, a resistor, and the like). Alternatively, the electronic component 120 may be an integrated circuit (IC) indicating a chip in which hundreds to millions or more elements are integrated. The integrated circuit may be an application processor chip such as a central processor (for example, a CPU), a graphic processor (for example, a GPU), a digital signal processor, a cryptographic processor, a microprocessor, a microcontroller, or the like, but is not limited thereto.

Figure 5A:
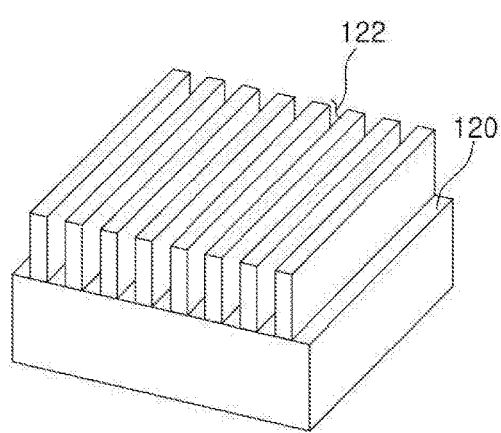
FIGS. 5A through 5D are perspective views schematically illustrating various shapes of the electronic component of FIG. 3.
Figure 5B:
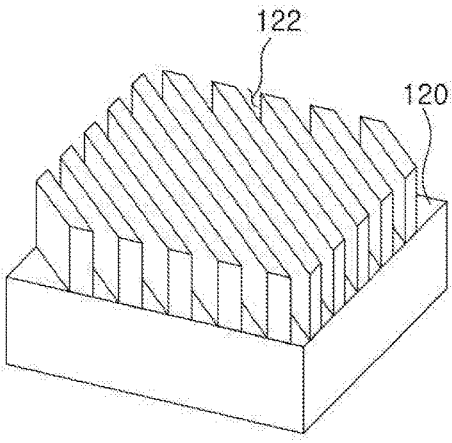
Figure 5C:
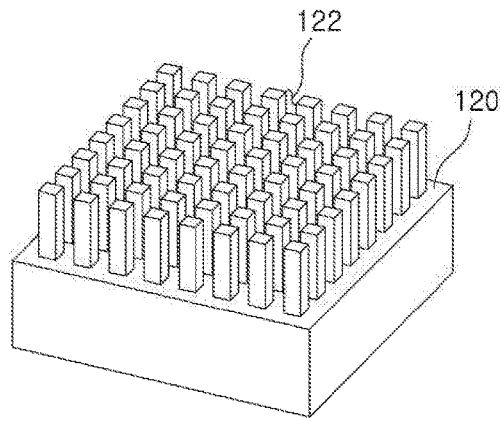
Figure 5D:
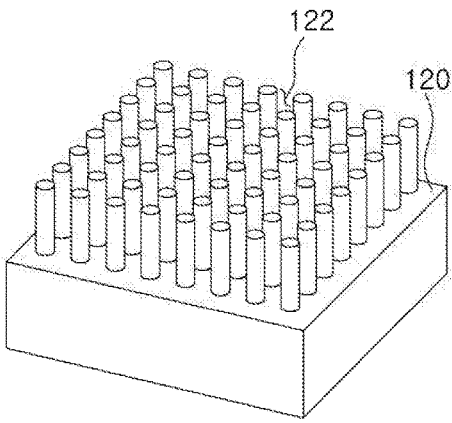

The upper side of the electronic component 120 may be processed to have a shape of the trench 122. As described above, the overall volume of the electronic component 120 may be reduced to increase the effective CTE of the electronic component package 100A, and the contact area between the electronic component 120 and the encapsulant 150 may be increased, through the trenches 122. The shape of the trench 122 is not particularly limited as long as it is strong through removing at least portions of the upper side of the electronic component 120. For example, the trench 122 may have a shape in which it includes a plurality of protrusion parts spaced apart from each other in one direction, as illustrated in FIGS. 5A and 5B, or a shape in which it includes a plurality of protrusion parts spaced apart from each other in a plurality of directions, as illustrated in FIGS. 5C and 5D, but is not limited thereto. Here, the protrusion part may have an approximately rectangular pillar shape, as illustrated in FIGS. 5A and 5B, have an approximately square pillar shape, as illustrated in FIG. 5C, or have an approximately cylindrical shape, as illustrated in FIG. 5D, but is not limited thereto.

The electrode pads 120P of the electronic component 120 may be electrically connected to the redistribution layers 130 and 140. The electronic pad 120P may electrically connect the electronic component 120 to the outside, and a material of the electrode pad 120P is not particularly limited as long as it is a conductive material. The conductive material may be copper (Cu), aluminum (Al), silver (Ag), tin (Sn), gold (Au), nickel (Ni), lead (Pd), or alloys thereof, or the like, but is not limited thereto. The electrode pad 120P may be redistributed by the redistribution layers 130 and 140. The electrode pad 120P may have a buried form or a protruding form.

In the case in which the electronic component 120 is the integrated circuit, the electronic component may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from the outside, and may be formed of, for example, an oxide layer, a nitride layer, or the like, or be formed of a double layer of an oxide layer and a nitride layer. A conductive material such as copper (Cu), aluminum (Al), silver (Ag), tin (Sn), gold (Au), nickel (Ni), lead (Pd), or alloys thereof, or the like, may be used as a material of the electrode pad 120P. A layer on which the electrode pads 120P are formed may become an active layer.

A thickness of the electronic component 120 in a cross section thereof is not particularly limited, but may be changed depending on a kind of electronic component 120. For example, in a case in which the electronic component is the integrated circuit, a thickness of the electronic component may be about 100 μm to 480 μm, but is not limited thereto. The thickness of the electronic component 120 in the cross-section thereof may be the same as or be thinner than that of a frame 110 in a cross-section thereof to be described below. In this case, the electronic component 120 may be more easily protected.

The redistribution layers 130 and 140 may redistribute the electrode pads 120P of the electronic component 120. Tens to hundreds of electrode pads 120P having various functions may be redistributed through the redistribution layers 130 and 140 and may be physically and/or electrically connected to the outside through connection terminals 165 to be described below depending on functions thereof. The redistribution layers 130 and 140 may include insulating layers 131 and 141, wiring patterns 132 and 142 each disposed on the insulating layers 131 and 141, and vias 133 and 143 each penetrating through the insulating layers 131 and 141, respectively. Although the redistribution layers 130 and 140 are formed of a plurality of layers in the electronic component package 100A according to an example, the redistribution layers 130 and 140 are not limited thereto, but may also be formed of a single layer in some cases. In addition, the redistribution layers 130 and 140 are not necessarily formed of two layers, but may also be formed of a plurality of layers more than two layers.

An insulating material may be used as materials of the insulating layers 131 and 141. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, Ajinomoto Build up Film (ABF), FR-4, Bismaleimide Triazine (BT), or the like. In a case in which a photosensitive insulating material such as a photo imagable dielectric (PID) resin is used as materials of the insulating layers 131 and 141, the insulating layers 131 and 141 may be formed at a reduced thickness, and a fine pitch may be easily implemented. Thicknesses of the insulating layers 131 and 141 are also not particularly limited. For example, thicknesses of the insulating layers 131 and 141 except for the wiring patterns 132 and 142 may be about 5 μm to 20 μm, and thicknesses of the insulating layers 131 and 141 when considering thicknesses of the wiring patterns 132 and 142 may be about 15 μm to 70 μm. The respective insulating layers 131 and 141 may be formed of the same insulating material or different insulating materials. In a case in which the respective insulating layers 131 and 141 are formed of the same insulating material, a boundary between the respective insulating layers 131 and 141 may not be apparent in some case, but is not necessarily limited thereto.

The wiring patterns 132 and 142 may serve as a redistribution wiring, or the like, and a conductive material such as copper (Cu), aluminum (Al), silver (Ag), tin (Sn), gold (Au), nickel (Ni), lead (Pd), or alloys thereof, or the like, may be used as materials of the wiring patterns 132 and 142. The wiring patterns 132 and 142 may perform various functions depending on a design of the corresponding layers. For example, the wiring patterns 132 and 142 may serve as a ground (GND) pattern, a power (PWR) pattern, a signal (S) pattern, and the like. Here, the signal (S) pattern may include various signals except for the ground (GND) pattern, the power (PWR) pattern, and the like, for example, data signals, and the like. In addition, the wiring patterns 132 and 142 may serve as a via pad, a connection terminal pad, or the like. Thicknesses of the wiring patterns 132 and 142 are also not particularly limited, but may be, for example, about 10 μm to 50 μm.

A surface treatment layer may be further formed on exposed portions of the wiring patterns 132 and 142, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 133 and 143 may electrically connect the wiring patterns 132 and 142, the electrode pads 120P, and the like, formed on different layers to each other, thereby forming an electrical path within the electronic component package 100A. A conductive material such as copper (Cu), aluminum (Al), silver (Ag), tin (Sn), gold (Au), nickel (Ni), lead (Pd), or alloys thereof, or the like, may be used as materials of the vias 133 and 143. The vias 133 and 143 may be completely filled with a conductive material. Alternatively, a conductive material may be formed along walls of the vias. In addition, the vias 133 and 143 may have all of the shapes known in the related art, such as a tapered shape in which a diameter of the via becomes small toward a lower surface, a reverse tapered shape in which a diameter of the via is increased toward a lower surface, a cylindrical shape, and the like.

The encapsulant 150 may protect the electronic component 120. To this end, the encapsulant 150 may encapsulate the electronic component 120. An encapsulation form is not particular limited, but may be, for example, a form in which the encapsulant 150 covers an upper side of the electronic component 120 and encloses the surrounding of the electronic component 120. A detailed material of the encapsulant 150 is not particularly limited. For example, an insulating material may be used as a material of the encapsulant 150. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, ABF, FR-4, BT, a PID resin, or the like. In addition, the known molding material such as an epoxy molding compound (EMC), or the like, may also be used.

The encapsulant 150 may contain conductive particles in order to block electromagnetic waves, if necessary. For example, the conductive particle may be any material that may block electromagnetic waves, for example, copper (Cu), aluminum (Al), silver (Ag), tin (Sn), gold (Au), nickel (Ni), lead (Pd), solder, or the like, but is not particularly limited thereto.

The electronic component package 100A according to an example may further include a metal layer 121 disposed on a surface of the upper side of the electronic component 120. The metal layer 121 may be to implement heat radiation and/or electromagnetic wave blocking of the electronic component 120. Heat generated in the electronic component 120 may be effectively radiated, and electromagnetic waves may be more effectively blocked, through the metal layer 121. Particularly, in the electronic component package 100A according to an example, since the trenches 122 are formed at the upper side of the electronic component 120, an area of the metal layer 121 disposed on the surface of the upper side of the electronic component 120 may be increased as compared to a general case in which an upper side has a flat surface. As a result, a heat radiation effect and/or electromagnetic waves blocking effect may be improved. A material of the metal layer 121 is not particularly limited as long as it is a metal having high thermal conductivity. For example, copper (Cu), aluminum (Al), silver (Ag), tin (Sn), gold (Au), nickel (Ni), lead (Pd), or alloys thereof, or the like, may be used as a material of the metal layer 121.

The electronic component package 100A according to an example may further include a frame 110. The frame 110 may be to give rigidity to the electronic component package 100A. The rigidity of the electronic component package 100A may be maintained and uniformity of a thickness of the electronic component package 100A may be secured by the frame 110. In addition, the frame 110 may provide a wider routing region. The frame 110 may have an upper surface and a lower surface opposing the upper surface. Here, a through-hole may penetrate between the upper surface and the lower surface. The electronic component 120 may be disposed in the through-hole so as to be spaced apart from the frame 110 by a predetermined distance. As a result, the surrounding of side surfaces of the electronic component 120 may be enclosed by the frame 110. A space between the frame 110 and the electronic component 120 may be filled with the encapsulant 150.

A material of the frame 110 is not particularly limited as long as the frame may support the electronic component package. For example, an insulating material may be used as a material of the frame 110. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, ABF, FR-4, BT, or the like. Alternatively, a metal having excellent rigidity and thermal conductivity may be used as a material of the frame 110. Here, the metal may be a Fe—Ni based alloy. In this case, a Cu plating may also be formed on a surface of the Fe—Ni based alloy in order to secure adhesion between the Fe—Ni based alloy and the encapsulant, or the like. In addition to the materials as described above, glass, ceramic, plastic, or the like, may also be used as a material of the frame 110. The frame 110 may have an elastic modulus at least larger than that of the encapsulant 150 in order to maintain the rigidity. A thickness of the frame 110 in a cross section thereof is not particularly limited, but may be designed depending on a thickness of the electronic component 120 in a cross section thereof. For example, a thickness of the frame 110 may be about 100 µm to 500 µm depending on a kind of electronic component 120.

The electronic component package 100A according to an example may further include through-wirings 115 penetrating through the upper surface and the lower surface of the frame 110, and wiring patterns 112A and 112B each disposed on the upper surface and the lower surface of the frame 110. The through-wiring 115 may serve to electrically connect the wiring patterns 112A and 112 disposed on different layers to each other. The wiring patterns 112A and 112B may serve as redistribution wirings of the electrode pads 120P of the electronic component 120.

A conductive material such as copper (Cu), aluminum (Al), silver (Ag), tin (Sn), gold (Au), nickel (Ni), lead (Pd), or alloys thereof, or the like, may be used as a material of the through-wiring 115. Upper and lower sides of the frame 110 may be connected to each other through left and right sides via the through-wirings 115. Therefore, space utilization may be significantly increased. In addition, the electronic component package may be applied to a package-on-package (PoP), or the like, through connection in a three-dimensional structure, such that the electronic component package may be applied to various modules, package applied product groups, or the like.

The number, an interval, a disposition form, and the like, of through-wirings 115 are not particularly limited, but may be sufficiently modified depending on design particulars by those skilled in the art. The through-wirings 115 may be connected to pad patterns serving as pads of the through-wirings among the wiring patterns 112A and 112B. In a case in which a metal, for example, a Fe—Ni based alloy, or the like, is used as a material of the frame 110, an insulating material may be disposed between the metal and the through-wirings 115 and/or the wiring patterns 112A and 112B in order to electrically insulate between the metal and the through-wirings 115 and/or the wiring patterns 112A and 112B.

A conductive material such as copper (Cu), aluminum (Al), silver (Ag), tin (Sn), gold (Au), nickel (Ni), lead (Pd), or alloys thereof, or the like, may be used as materials of the wiring patterns 112A and 112B. The wiring patterns 112A and 112B may perform various functions depending on a design of the corresponding layers. For example, the wiring patterns 112A and 112B may serve as a ground (GND) pattern, a power (PWR) pattern, a signal (S) pattern, a bond finger (BF) pattern, and the like. Here, the signal (S) pattern may include various signals except for the ground (GND) pattern, the power (PWR) pattern, the bond finger (BF) pattern, and the like, for example, data signals, and the like. In addition, the wiring patterns 112A and 112B may serve as a via pad, a through-wiring pad, a connection terminal pad, or the like. Thicknesses of the wiring patterns 112A and 112B are also not particularly limited, but may be, for example, about 10 µm to 50 µm. The wiring patterns 112A and 112B may also be dummy patterns that do not perform a redistribution function in some cases.

The electronic component package 100A according to an example may further include insulating layers 111A and 111B each disposed on the upper surface and the lower surface of the frame 110. The insulating layers 111A and 111B may be to form further wiring patterns before the electronic component 120 is disposed. As the number of insulating layers 111A and 111B is increased, more wiring patterns may be formed on the corresponding layers, such that the number of layers in the redistribution layers 130 and 140 may be decreased. As a result, the probability that the electronic component 120 will not be used due to a defect occurring in a process of forming the redistribution layers 130 and 140 after the electronic component 120 is disposed may be decreased. That is, a problem that a yield is decreased due to a process defect after the electronic component 120 is disposed may be prevented. Through-holes penetrating through the insulating layers 111A and 111B may also be formed in the insulating layers 111A and 111B, and may be integrated with the through-hole penetrating through the frame 110. In this case, the electronic component 120 may be disposed in the integrated through-hole. Wiring patterns 114 may also be disposed on the insulating layers 111A and 111B, and vias 113 may also be disposed in the insulating layers 111A and 111B.

An insulating material may be used as materials of the insulating layers 111A and 111B. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, ABF, FR-4, BT, or the like. In a case in which a photosensitive insulating material such as a photosensitive insulating resin is used as materials of the insulating layers 111A and 111A, the insulating layers 111A and 111B may be formed at a reduced thickness, and a fine pitch may be easily implemented. Thicknesses of the insulating layers 111A and 111B are also not particularly limited. For example, thicknesses of the insulating layers 111A and 111B except for the wiring patterns 112A and 112B may be about 5 µm to 20 µm, and thicknesses of the insulating layers 111A and 111B when considering thicknesses of the wiring patterns 112A and 112B may be about 15 µm to 70 µm. The respective insulating layers 111A and 111B may contain the same insulating material or different insulating materials. In addition, the insulating layers 111A and 111B may have approximately the same thickness or different thicknesses. In a case in which materials of the insulating layers 111A and 111B are the same as each other, thicknesses of the insulating layers 111A and 111B are approximately the same as each other, and the numbers of insulating layers 111A and 111B are the same as each other, the insulating layers 111A and 111B may be symmetrical to each other in relation to the frame 110, which may be more easy in controlling warpage.

The insulating layer 111A may have openings 151 exposing portions of the wiring pattern 112A. Here, the openings 151 may be formed in the encapsulant 150 as well as the insulating layer 111A. That is, the openings 151 may simultaneously penetrate through at least portions of the insulating layer 111A and the encapsulant 150. The wiring pattern 112A exposed by the openings 151 may be a wire bonding pad for connection to another electronic component, another electronic component package, or the like, disposed on the electronic component package 100A.

The electronic component package 100A according to an example may further include a metal layer 117 disposed on an inner wall of the through-hole of the frame 110. The metal layer 117 may be to implement heat radiation and/or electromagnetic wave blocking of the electronic component 120. Heat generated in the electronic component 120 may be effectively radiated, and electromagnetic waves may be more effectively blocked, through the metal layer 117. In a case in which the insulating layers 111A and 111B are disposed on the upper surface and the lower surface of the frame 110, respectively, and the metal layer 117 may also be disposed on inner walls of the through-holes of the corresponding insulting layers 111A and 111B. That is, the metal layer 117 may be disposed in an inner wall of the integrated through-hole. A material of the metal layer 117 is not particularly limited as long as it is a metal having high thermal conductivity. For example, copper (Cu), aluminum (Al), silver (Ag), tin (Sn), gold (Au), nickel (Ni), lead (Pd), or alloys thereof, or the like, may be used as a material of the metal layer 117.

The electronic component package 100A according to an example may further include an outer layer 160 disposed below the redistribution layers 130 and 140 and having openings 161, and the connection terminals 165 disposed in the openings 161. The outer layer 160 may be to protect the redistribution layers 130 and 140 from external physical and chemical damage, or the like. The outer layer 160 may have the openings 161 exposing at least portions of the wiring pattern 142 of the redistribution layer 140. Although the openings 161 may expose portions of one surface of the wiring pattern 142, the openings 161 may also expose side surfaces of the wiring pattern 142 in some cases. The connection terminals 165 may be to physically and/or electrically connect the electronic component package 100A to the outside. For example, the electronic component package 100A may be mounted on the main board of the electronic device through the connection terminals 165. The connection terminals 165 may be disposed in the openings 161, and may be connected to the exposed portions of the wiring pattern 142 through the openings 161. Therefore, the connection terminals 165 may also be electrically connected to the electronic component 120.

A material of the outer layer 160 is not particularly limited. For example, a solder resist may be used as a material of the outer layer 140. In addition, the same material as that of the insulating layers 131 and 141 of the redistribution layers 130 and 140, for example, the same PID resin may also be used as a material of the outer layer 160. The outer layer 160 is generally a single layer, but may also be formed of multiple layers, if necessary.

The connection terminal 165 may be formed of a conductive material, for example, copper (Cu), aluminum (Al), silver (Ag), tin (Sn), gold (Au), nickel (Ni), lead (Pb), solder, or the like, but is not particularly limited thereto. The connection terminal 165 may be a land, a ball, a pin, or the like. The connection terminal 165 may be formed of multiple layers or a single layer. In a case in which the connection terminal 165 is formed of the multiple layers, the connection terminal 165 may contain a copper pillar and a solder, and in a case in which the connection terminal 165 is formed of the single layer, the connection terminal 165 may contain a tin-silver solder or copper. However, this is only an example, and the connection terminal 165 is not limited thereto.

At least one of the connection terminals 165 may be disposed in a fan-out region. The fan-out region means a region except for a region in which the electronic component is disposed. That is, the electronic component package 100A according to an example may be a fan-out package. The fan-out package may have reliability more excellent than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a thin thickness, and may have excellent price competitiveness.

The number, an interval, a disposition form, and the like, of connection terminals 165 are not particularly limited, but may be sufficiently modified depending on design particulars by those skilled in the art. For example, the number of connection terminals 165 may be several tens to several thousands depending on the number of electrode pads 120P of the electronic component 120. However, the number of connection terminals 165 is not limited thereto, but may also be several tens to several thousands or more or several tens to several thousands or less.

Figure 6:
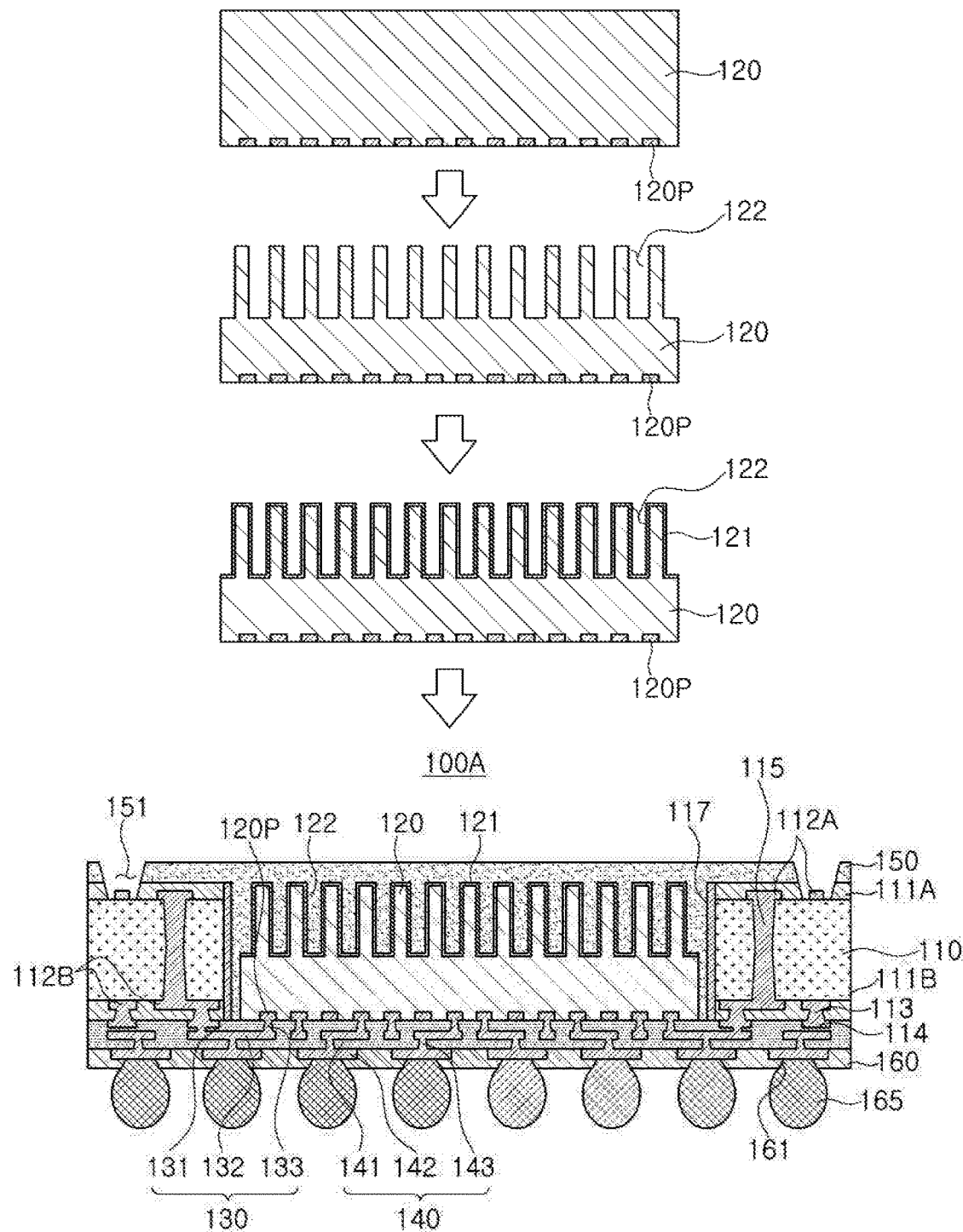
FIG. 6 shows schematic views illustrating an example of processes of manufacturing the electronic component package of FIG. 3.

FIG. 6 shows schematic views illustrating an example of processes of manufacturing the electronic component package of FIG. 3.

Referring to FIG. 6, the electronic component 120 having the electrode pads 120P disposed at a lower side thereof may be prepared. The trenches 122 may be formed by processing the upper side of the electronic component 120. The metal layer 121 may be formed on the surface of the upper side of the electronic component 120 in which the trenches 122 are formed. Then, the electronic component 120 in which the trenches 122 are formed and on which the metal layer 121 is formed may be packaged to form the electronic component package 100A.

Hereinafter, respective processes will be described in more detail. However, descriptions of contents overlapped with the contents described above will be omitted.

The electronic component 120 may be, for example, the integrated circuit that is not packaged, as described above. The integrated circuit may be the application processor chip such as the central processor (for example, the CPU), the graphic processor (for example, the GPU), the digital signal processor, the cryptographic processor, the microprocessor, the microcontroller, or the like, as described above, but is not limited thereto.

The trenches 122 may be processed by a method of removing portions of the upper side of the electronic component 120. Here, the portions of the upper side of the electronic component 120 may be removed by the known method. For example, the trenches 122 may be formed by mechanical drilling and/or laser drilling, a sand blast method using polishing particles, a dry etching method using plasma, or the like. In a case in which the trenches 122 are formed using mechanical drilling and/or laser drilling, resin smears in the trenches 122 may be removed by performing a desmearing process such as a permanganate method, or the like. A size, a shape, or the like, of the trench 122 is not particularly limited.

The metal layer 121 may also be formed by the known method. For example, the metal layer 121 may be formed by electrolytic copper plating, electroless copper plating, or the like, using a dry film pattern. Alternatively, the metal layer 121 may be formed using a method such as chemical vapor deposition (CVD), physical vapor deposition (PVD), sputtering, a subtractive process, an additive process, a semi-additive process (SAP), a modified semi-additive process (MSAP), or the like, but is not limited thereto.

Packaging of the electronic component 120 may be changed depending on a form of the electronic component package. In a case of the electronic component package 100A according to an example, the frame 110 may first be prepared, and the through-wirings 115, the wiring patterns 112A and 112B, and the like, may be formed. Then, the insulating layers 111A and 111B may be formed, and other wiring patterns, vias, and the like, may be formed. In addition, the integrated through-hole and the metal layer 117 may be formed. Then, the electronic component 120 may be disposed in the integrated through-hole. Then, the encapsulant 150 may be formed. Then, the redistribution layers 130 and 140, the outer layer 160, the connection terminals 165, and the like, may be formed.

The frame 110 may be manufactured and utilized at various sizes in order to facilitate mass production. That is, after the frame 110 having a large size is prepared, a plurality of electronic component packages 100A may be manufactured through a process to be described below. Then, the plurality of electronic component packages 100A may be singulated into unit packages through a sawing process, or the like. A fiducial mark for excellent pick-and-place (P&P) may be present in the frame 110. Since a position at which the electronic component 120 is mounted may be more clearly recognized through the fiducial mark, completeness of manufacturing may be improved. Meanwhile, descriptions of contents overlapped with the contents described above will be omitted.

The through-wirings 115 may be formed by the known method. For example, the through-wirings 115 may be formed by forming holes for the through-wirings using mechanical drilling, laser drilling, or the like, and then performing electrolytic copper plating, electroless copper plating, or the like, using a dry film pattern. In addition, the wiring patterns 112A and 112B may also be formed by the known method. For example, the wiring patterns 112A and 112B may be formed by electrolytic copper plating, electroless copper plating, or the like, using a dry film pattern.

The insulating layers 111A and 111B may be formed by the known method, for example, a method of laminating precursors of the insulating layers 111A and 111B and then hardening the precursors, a method of applying materials for forming the insulating layers 111A and 111B and then hardening the materials, or the like, but are not limited thereto. As the method of laminating the precursor, for example, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink by squeegee, a spray printing method of applying ink in a mist form, or the like, may be used. The hardening process, a post-process, may be a process of drying the material so as not to be completely hardened in order to use a photolithography method, or the like. Methods of forming other wiring patterns, vias, and the like, are the same as the method described above.

A method of forming the through-hole is also not particularly limited. The through-hole may be formed by, for example, mechanical drilling and/or laser drilling, a sand blasting method using polishing particles, a dry etching method using plasma, or the like. In a case in which the through-hole is formed using mechanical drilling and/or laser drilling, a resin smear in the through-hole may be removed by performing a desmearing process such as a permanganate method, or the like. A size, a shape, or the like, of the through-hole may be designed depending on a size, a shape, the number, or the like, of electronic components 120 to be mounted. Meanwhile, descriptions of contents overlapped with the contents described above will be omitted.

The electronic component 120 may be disposed using an adhesive film. For example, the electronic component 120 may be disposed by attaching the adhesive film to a lower side of the insulating layer 111B and attaching the electronic component to a space exposed through the integrated through-hole. The adhesive film may be removed after the encapsulant 150 is formed and before the redistribution layers 130 and 140 are formed. The electronic component 120 may be disposed in a face-down form so that the electrode pads 120P are oriented toward the bottom.

The encapsulant 150 may be formed by the known method. For example, the encapsulant 150 may be formed by a method of laminating a precursor of the encapsulant 150 and then hardening the precursor. Alternatively, the encapsulant 150 may also be formed by a method of applying a material for forming the encapsulant 150 and then hardening the material. The encapsulant 150 may fix the electronic component 120 by the hardening. Therefore, a problem that the electronic component 120 moves in a subsequent process may be significantly reduced. As the method of laminating the precursor, for example, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink by squeegee, a spray printing method of applying ink in a mist form, or the like, may be used. Meanwhile, descriptions of contents overlapped with the contents described above will be omitted.

The redistribution layers 130 and 140 may be formed by forming the insulating layers 131 and 141 and then forming the wiring patterns 132 and 142 on the insulating layers 131 and 141 and forming the vias 133 and 143 in the insulating layers 131 and 141, respectively. The insulating layers 131 and 141, the wiring patterns 132 and 142, the vias 133 and 143 and the like, may be formed by the known method as described above.

The outer layer 160 may also be formed by a method of laminating a precursor of the outer layer 160 and then hardening the precursor, a method of applying a material for forming the outer layer 160 and then hardening the material, or the like. The openings 161 may be formed using mechanical drilling and/or laser drilling. Alternatively, the openings 161 may be formed by a photolithography method. A method of forming the connection terminals 165 is not particularly limited. That is, the connection terminals 165 may be formed by the method well-known in the related art depending on a structure or a form of the connection terminals 165. The connection terminals 165 may be fixed by reflow, and portions of the connection terminals 165 may be buried in the outer layer 160 in order to enhance fixing force and the remaining portions of the connection terminals 165 may be exposed externally, whereby reliability may be improved.

Figure 7:
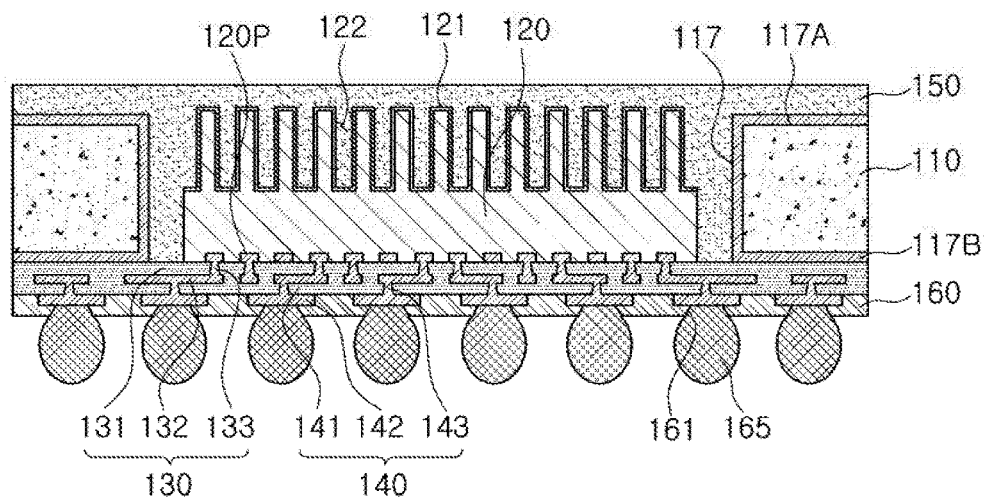
FIG. 7 is a cross-sectional view schematically illustrating another example of an electronic component package.

FIG. 7 is a cross-sectional view schematically illustrating another example of an electronic component package.

Referring to FIG. 7, an electronic component package 100B according to another example is different from the electronic component package 100A according to an example. In the electronic component package 100B, only a frame 110 having a through-hole is disposed in a region in which an electronic component 120 is encapsulated and metal layers 117, 117A, and 117B are disposed on an inner surface of the through-hole of the frame 110 and an upper surface and a lower surface of the frame 110. Since respective components are the same as the components described above, a description therefor will be omitted.

Figure 8:
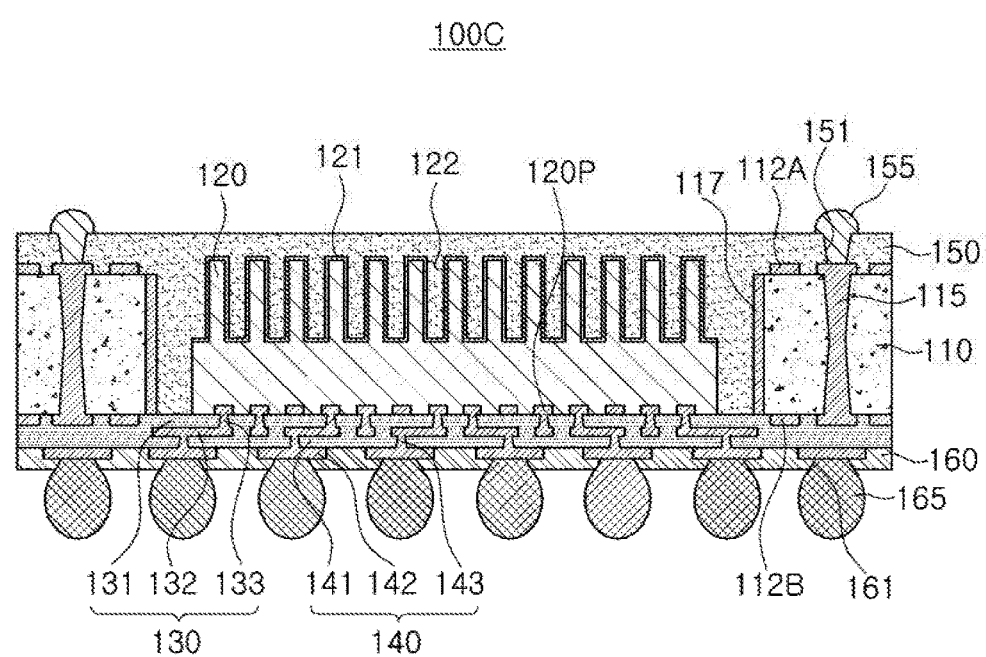
FIG. 8 is a cross-sectional view schematically illustrating another example of an electronic component package.

FIG. 8 is a cross-sectional view schematically illustrating another example of an electronic component package.

Referring to FIG. 8, an electronic component package 100C according to another example is different from the electronic component package 100A according to an example. In the electronic component package 100C, only a frame 110 having a through-hole is disposed in a region in which an electronic component 120 is encapsulated, a metal layer 117 is disposed on an inner surface of the through-hole of the frame 110, and wiring patterns 112A and 112B are disposed on an upper surface and a lower surface of the frame 110. In addition, the electronic component package 100C may include through-wirings 115 penetrating through the frame 110. In addition, an encapsulant 150 may have openings 151 opening portions of the wiring pattern 112A, and connection terminals 155 may be disposed in the openings 151. The connection terminals 155 may provide an electrical path in a case in which other electronic component package, or the like, is stacked on the electronic component package 100C. Since respective components are the same as the components described above, a description therefor will be omitted.

Figure 9:
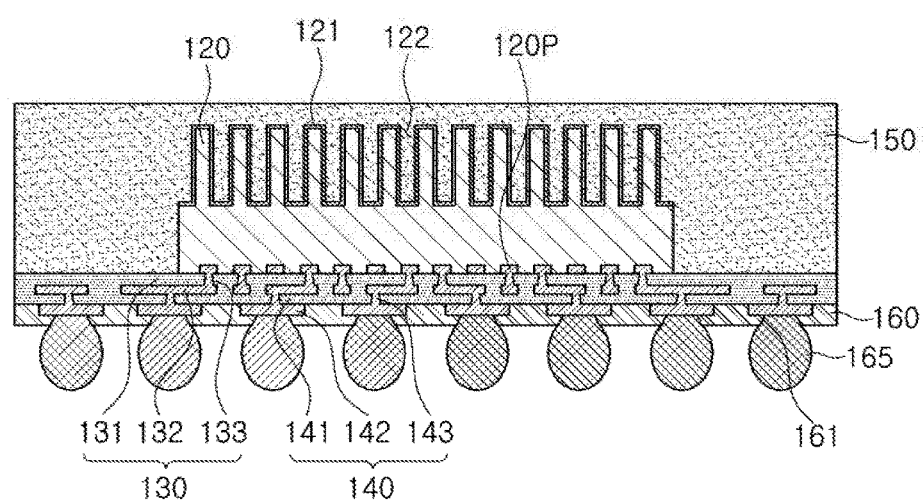
FIG. 9 is a cross-sectional view schematically illustrating another example of an electronic component package.

FIG. 9 is a cross-sectional view schematically illustrating another example of an electronic component package.

Referring to FIG. 9, an electronic component package 100D according to another example is different from the electronic component package 100A according to an example. In the electronic component package 100D, only an electronic component 120 is disposed in a region in which the electronic component 120 is encapsulated. That is, contents of the present disclosure may also be applied to a wafer level package as in the electronic component package 100D according to another example. Since respective components are the same as the components described above, a description therefor will be omitted.

Figure 10:
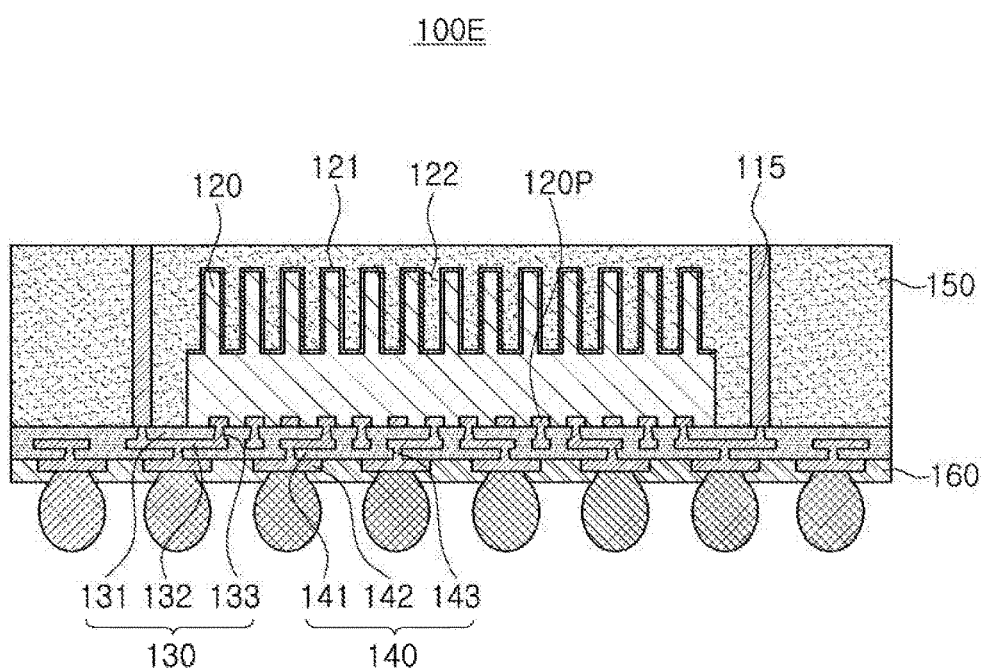
FIG. 10 is a cross-sectional view schematically illustrating another example of an electronic component package.

FIG. 10 is a cross-sectional view schematically illustrating another example of an electronic component package.

Referring to FIG. 10, an electronic component package 100E according to another example is different from the electronic component package 100A according to an example. In the electronic component package 100E, only an electronic component 120 is disposed in a region in which the electronic component 120 is encapsulated. However, the electronic component package 100E may include through-wirings 115 penetrating through the encapsulant 150. That is, contents of the present disclosure may also be applied to a package-on-package type of wafer level package as in the electronic component package 100E according to another example. Since respective components are the same as the components described above, a description therefor will be omitted.

As set forth above, according to an exemplary embodiment in the present disclosure, an electronic component package of which board level reliability is improved, and a method of manufacturing the same may be provided.

Meanwhile, in the present disclosure, a word "connected" is a concept including a case in which any component is indirectly connected to another component by an adhesive, or the like, as well as a case in which any component is directly connected to another component. In addition, a word "electrically connected" is a concept including both of a case in which any component is physically connected to another component and a case in which any component is not physically connected to another component.

In addition, in the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

In addition, a term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

In addition, terms used in the present disclosure are used only in order to describe an example rather than limiting the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. An electronic component package comprising:
    a frame having a through-hole;
    an electronic component disposed in the through-hole of the frame;
    a redistribution layer disposed on one side of the electronic component and the frame;
    a metal layer disposed on an inner wall of the frame; and
    an encapsulant encapsulating the electronic component and the frame, and filling at least a space, between the electronic component and the frame, of through-hole of the frame,
    wherein the electronic component has a trench formed in one side thereof.

2. The electronic component package of claim 1, wherein the trench is confined by protrusion parts protruding from a body of the electronic component, and
    the body and protrusion parts are an integral portion and are made of a same material.

3. The electronic component package of claim 1, wherein the electronic component has a plurality of protrusion parts formed on the one side thereof adjacently to the trench.

4. The electronic component package of claim 3, wherein the protrusion part has a square pillar shape, a rectangular pillar shape, or a cylindrical pillar shape.

5. The electronic component package of claim 1, wherein the trench of the electronic component is filled with the encapsulant.

6. The electronic component package of claim 5, wherein a coefficient of thermal expansion (CTE) of the electronic component is less than that of the encapsulant filled in the trench of the electronic component.

7. The electronic component package of claim 1, wherein the encapsulant is a solid material.

8. The electronic component package of claim 1, wherein the electrode component is an integrated circuit having an electrode pad formed on the other side thereof, and
the electrode pad of the integrated circuit is oriented toward the redistribution layer.

9. The electronic component package of claim 1, further comprising another metal layer disposed on a wall of the trench of the electronic component.

10. The electronic component package of claim 1, further comprising:
a through-wiring penetrating through the frame; and
wiring patterns disposed on both surfaces of the frame opposing each other.

11. The electronic component package of claim 10, further comprising insulating layers disposed on both surfaces of the frame opposing each other,
wherein one of the insulating layers has openings exposing the wiring patterns.

12. The electronic component package of claim 1, further comprising:
an outer layer disposed on one side of the redistribution layer and having openings; and
connection terminals disposed in the openings.

13. An electronic component package comprising:
a redistribution layer;
an electronic component disposed on the redistribution layer and including a body and protrusion parts protruding from the body;
a metal layer including a plurality of sections respectively disposed on side surfaces of the protrusion parts; and
an encapsulant encapsulating the electronic component and filling spaces between the plurality of sections of the metal layer.

14. The electronic component package of claim 13, wherein the body and the protrusion parts are an integral portion and are made of a same material.

15. The electronic component package of claim 13, wherein a coefficient of thermal expansion (CTE) of the electronic component is less than that of the encapsulant filled between the plurality of sections of the metal layer.

16. The electronic component package of claim 13, wherein the encapsulant is a solid material.

17. The electronic component package of claim 13, wherein the electrode component is an integrated circuit having an electrode pad one side of the electronic component opposing the protrusion parts, and
the electrode pad of the integrated circuit is oriented toward the redistribution layer.

18. The electronic component package of claim 13, further comprising a frame disposed on the redistribution layer and having a through-hole,
wherein the electronic component is disposed in the through-hole, and
the encapsulant fills a space, between the electronic component and the frame, of through-hole.

19. The electronic component package of claim 18, further comprising:
a through-wiring penetrating through the frame; and
wiring patterns disposed on both surfaces of the frame opposing each other.

20. The electronic component package of claim 13, further comprising:
an outer layer disposed on one side of the redistribution layer and having openings; and
connection terminals disposed in the openings.

* * * * *